United States Patent
Pitts

(10) Patent No.: US 12,200,910 B2
(45) Date of Patent: Jan. 14, 2025

(54) CLAMPED PYROLYTIC GRAPHITE SHEETS FOR HEAT SPREADING

(71) Applicant: Raytheon Company, Waltham, MA (US)

(72) Inventor: Andrew J. Pitts, Newton, MA (US)

(73) Assignee: RAYTHEON COMPANY, Waltham, MA (US)

( * ) Notice: Subject to any disclaimer, the term of this patent is extended or adjusted under 35 U.S.C. 154(b) by 224 days.

(21) Appl. No.: 17/576,437

(22) Filed: Jan. 14, 2022

(65) Prior Publication Data
US 2023/0232586 A1    Jul. 20, 2023

(51) Int. Cl.
H05K 7/20    (2006.01)
F28F 21/02   (2006.01)

(52) U.S. Cl.
CPC ......... H05K 7/2039 (2013.01); F28F 21/02 (2013.01)

(58) Field of Classification Search
CPC . F28F 21/02; H05K 7/20509; H05K 7/20481; H05K 7/2039
USPC ...................................................... 165/80.2
See application file for complete search history.

(56) References Cited

U.S. PATENT DOCUMENTS

| | | | |
|---|---|---|---|
| 5,296,310 A | 3/1994 | Kibler et al. | |
| 5,933,323 A * | 8/1999 | Bhatia | H01L 23/04 174/15.2 |
| 6,597,575 B1 * | 7/2003 | Matayabas, Jr. | H01L 23/3737 361/708 |
| 7,760,504 B2 * | 7/2010 | Farrow | H01L 23/433 361/705 |
| 8,085,531 B2 * | 12/2011 | Lemak | H01L 23/3735 361/708 |
| 8,475,923 B2 * | 7/2013 | Katayama | H01L 21/268 361/708 |
| 9,041,192 B2 * | 5/2015 | Saeidi | H01L 23/42 257/710 |
| 10,225,952 B2 * | 3/2019 | Chainer | G06F 1/20 |
| 11,037,860 B2 * | 6/2021 | Hoffmeyer | H05K 1/0203 |
| 2004/0075076 A1 * | 4/2004 | Bhagwagar | H01C 1/084 252/70 |
| 2005/0064230 A1 | 3/2005 | Sayir et al. | |
| 2008/0156457 A1 * | 7/2008 | Schaenzer | B23K 35/02 361/705 |
| 2010/0327430 A1 * | 12/2010 | Jadhav | H01L 23/3735 165/185 |

(Continued)

FOREIGN PATENT DOCUMENTS

EP    2454551 B1    4/2017
EP    3726572 A1    10/2020

OTHER PUBLICATIONS

"Introduction to Aluminum and Magnesium Annealed Pyrolytic Graphite (k-Core)" Thermacore, Thermal Management Solutions, k Technology Division, MEPTEC Thermal Management Symposium, Mar. 19, 2012 (24 pages).

(Continued)

*Primary Examiner* — Claire E Rojohn, III
(74) *Attorney, Agent, or Firm* — CANTOR COLBURN LLP

(57) ABSTRACT

A heat spreading element is provided. The heat spreading element includes compressible pyrolytic graphite sheets and rigid pyrolytic graphite sheets interleaved with the compressible pyrolytic graphite sheets.

20 Claims, 4 Drawing Sheets

(56) References Cited

U.S. PATENT DOCUMENTS

| | | | |
|---|---|---|---|
| 2011/0096507 A1* | 4/2011 | Deram | H01L 23/42 |
| | | | 228/141.1 |
| 2011/0311767 A1* | 12/2011 | Elahee | C08L 83/04 |
| | | | 252/78.3 |
| 2012/0024512 A1* | 2/2012 | Yamamoto | H01L 23/42 |
| | | | 165/185 |
| 2012/0234524 A1* | 9/2012 | Fan | B32B 9/007 |
| | | | 165/185 |
| 2013/0081796 A1* | 4/2013 | Horiuchi | H01L 21/4882 |
| | | | 156/247 |
| 2014/0262192 A1* | 9/2014 | Boday | C09J 5/06 |
| | | | 252/78.3 |
| 2014/0362532 A1 | 12/2014 | Kubo et al. | |
| 2015/0062822 A1* | 3/2015 | Aoki | H01L 23/3675 |
| | | | 165/104.28 |
| 2018/0306530 A1 | 10/2018 | Francis et al. | |
| 2020/0024008 A1* | 1/2020 | Mena | B64G 1/503 |
| 2020/0307158 A1 | 10/2020 | Sinfield et al. | |

OTHER PUBLICATIONS

International Search Report with Written Opinion issued in International Application No. PCT/US2023/010663; International Filing Date Jan. 12, 2023; Date of Mailing May 3, 2023 (14 pages).

* cited by examiner

CLAMPED PYROLYTIC GRAPHITE SHEETS FOR HEAT SPREADING

BACKGROUND

The present disclosure relates to heat spreading and, in particular, to a heat spreader with clamped pyrolytic graphite sheets (PGS).

A heat spreader is an assembly that is used to transfer heat, which is generated by an electronic device or module, from the electronic device or module in a first direction and to spread that heat out in second directions. In some cases, the heat spreader includes the module, a cold plate or a heat exchanger, and a heat spreading element interposed between the module and the cold plate. The heat spreading element transfers heat generated by the module toward the cold plate and in doing so spreads the heat out.

In conventional heat spreaders, the heat spreading element was provided by monolithic copper spreaders. These monolithic copper spreaders tend to be heavy. As such, conventional heat spreaders that include monolithic copper spreaders tend to be heavy as well.

SUMMARY

According to an aspect of the disclosure, a heat spreading element is provided. The heat spreading element includes compressible pyrolytic graphite sheets and rigid pyrolytic graphite sheets interleaved with the compressible pyrolytic graphite sheets.

In accordance with additional or alternative embodiments, at least one of the compressible pyrolytic graphite sheets and the rigid pyrolytic graphite sheets exhibits in-plane thermal conductivity of greater than about 1000 W/m-K, and densities of the compressible pyrolytic graphite sheets and the rigid pyrolytic graphite sheets are less than about 10% a density of copper.

In accordance with additional or alternative embodiments, the compressible pyrolytic graphite sheets and the rigid pyrolytic graphite sheets are compressed together in an interleaving direction.

In accordance with additional or alternative embodiments, the compressible pyrolytic graphite sheets and the rigid pyrolytic graphite sheets are clamped in the interleaving direction.

According to an aspect of the disclosure, a heat spreader is provided and includes compressible pyrolytic graphite sheets, rigid pyrolytic graphite sheets interleaved with the compressible pyrolytic graphite sheets to form a heat spreading element to provide for a transfer of heat and to spread the heat out and a clamp to clamp the heat spreading element and to compress the compressible pyrolytic graphite sheets and the rigid pyrolytic graphite sheets in a direction of the transfer of the heat.

In accordance with additional or alternative embodiments, at least one of the compressible pyrolytic graphite sheets and the rigid pyrolytic graphite sheets exhibits in-plane thermal conductivity of greater than about 1000 W/m-K, and densities of the compressible pyrolytic graphite sheets and the rigid pyrolytic graphite sheets are less than about 10% a density of copper.

In accordance with additional or alternative embodiments, the direction of the transfer of the heat is an interleaving direction of the compressible pyrolytic graphite sheets and the rigid pyrolytic graphite sheets.

In accordance with additional or alternative embodiments, seals prevent moisture ingress to or about at least one of the heat spreading element and the clamp.

In accordance with additional or alternative embodiments, the heat spreading element further includes a transverse section comprising compressible and rigid pyrolytic graphite sheets oriented transversely relative to a rest of the heat spreading element.

In accordance with additional or alternative embodiments, the heat spreader further includes a module and a cold plate. The heat spreading element is interposed between the module and the cold plate to provide for the transfer of heat from the module to the cold plate in a first direction and to spread the heat out in a second direction transverse with respect to the first direction. The clamp is disposed and configured to clamp the heat spreading element between the module and the cold plate and to compress the compressible pyrolytic graphite sheets and the rigid pyrolytic graphite sheets in the first direction.

In accordance with additional or alternative embodiments, the module includes electronic elements that generate the heat.

In accordance with additional or alternative embodiments, the first direction is in an interleaving direction of the compressible pyrolytic graphite sheets and the rigid pyrolytic graphite sheets.

In accordance with additional or alternative embodiments, the clamp is tuned to compress the compressible pyrolytic graphite sheets and the rigid pyrolytic graphite sheets to optimize thermal performance.

In accordance with additional or alternative embodiments, seals prevent moisture ingress to or about at least one of the heat spreading element and the clamp.

In accordance with additional or alternative embodiments, a monolithic metallic element is interposed between the module and the cold plate with the heat spreading element.

In accordance with additional or alternative embodiments, the compressible pyrolytic graphite sheets provide for CTE mismatch compliance among the module, the monolithic metallic element, the rigid pyrolytic graphite sheets, and the cold plate.

In accordance with additional or alternative embodiments, the monolithic metallic element defines a pocket in which the heat spreading element is disposable and a height of the pocket is less than a height of the heat spreading element prior to the compressible pyrolytic graphite sheets and the rigid pyrolytic graphite sheets being compressed.

According to an aspect of the disclosure, a method of assembling a heat spreader is provided and includes interleaving rigid pyrolytic graphite sheets with compressible pyrolytic graphite sheets to form a heat spreading element to provide for a transfer of heat and to spread the heat out and compressing the compressible pyrolytic graphite sheets and the rigid pyrolytic graphite sheets in a direction of the transfer of the heat.

In accordance with additional or alternative embodiments, the method further includes interposing the heat spreading element between a module and a cold plate to provide for the transfer of heat from the module to the cold plate in a first direction and to spread the heat out in a second direction transverse with respect to the first direction, and the compressing includes clamping the heat spreading element between the module and the cold plate to compress the compressible pyrolytic graphite sheets and the rigid pyrolytic graphite sheets in the first direction.

In accordance with additional or alternative embodiments, the method further includes comprising interposing a monolithic metallic element between the module and the cold plate with the heat spreading element.

Additional features and advantages are realized through the techniques of the present disclosure. Other embodiments and aspects of the disclosure are described in detail herein and are considered a part of the claimed technical concept. For a better understanding of the disclosure with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

As will be described below, high conductivity and lightweight materials are used in heat spreaders to provide heat spreader performance that is comparable or better to that of monolithic copper spreaders but with much less weight. In some cases, the high conductivity and lightweight materials are provided as clamped layers of compressible and incompressible or rigid PGS material. The clamping of the materials together offers further weight reduction possibilities.

Figure 1:
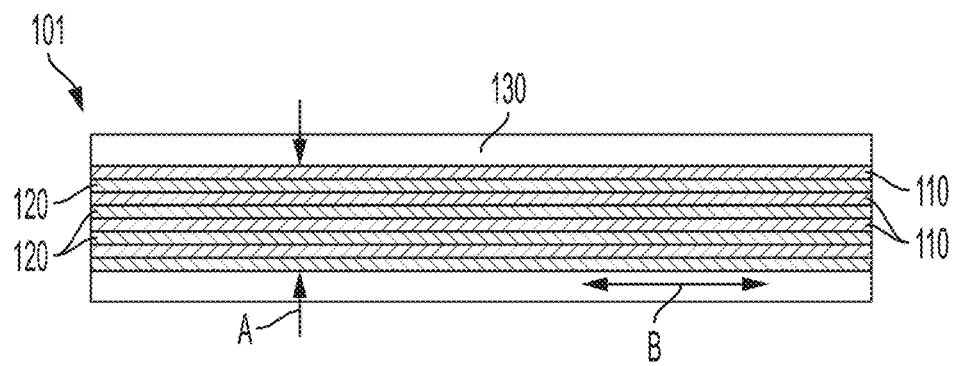
FIG. 1 is a schematic side view of a heat spreading element in accordance with embodiments.

With reference to FIG. 1, a heat spreading element 101 is provided and includes compressible pyrolytic graphite sheets 110 and rigid pyrolytic graphite sheets 120. The rigid pyrolytic graphite sheets 120 are interleaved with the compressible pyrolytic graphite sheets 110. At least one of the compressible pyrolytic graphite sheets 110 and the rigid pyrolytic graphite sheets 120 exhibits in-plane thermal conductivity of greater than about 1000 W/m-K. The compressible pyrolytic graphite sheets 110 and the rigid pyrolytic graphite sheets 120 are much less dense than metallic material, such as copper. For example, a density of the rigid pyrolytic graphite sheets 120 can be less than about 10% a density of metallic material. A density of the compressible pyrolytic graphite sheets 110 can be less than about 10% and, in some cases, less than about 5% a density of metallic material. The compressible pyrolytic graphite sheets 110 and the rigid pyrolytic graphite sheets 120 can be compressed together by, e.g., a clamp 130, in an interleaving direction A. This compression effectively activates the in-plane thermal conductivity of the compressible pyrolytic graphite sheets 110 and the rigid pyrolytic graphite sheets 120 so that the heat spreading element 101 can provide for a transfer of heat in a first direction (i.e., the interleaving direction A) and can spread the heat out in a second direction (i.e., an in-plane direction B).

In accordance with embodiments, the rigid pyrolytic graphite sheets 120 can have a density of about 1200-1300 kg/m3 and the compressible pyrolytic graphite sheets 110 can have a spongy quality with a density of about 400-500 kg/m3.

Figure 2:
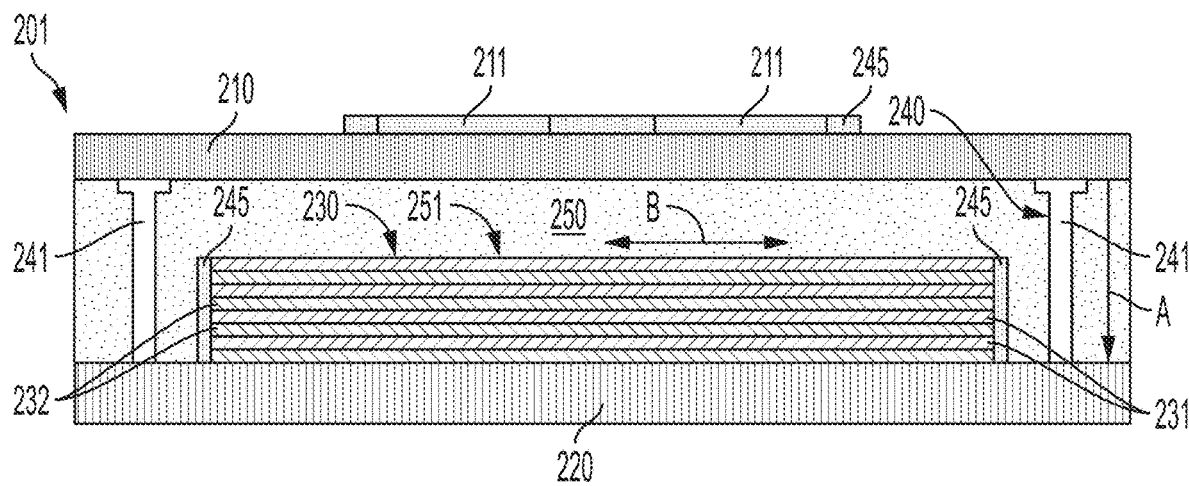
FIG. 2 is a schematic side view of a heat spreader with a heat spreading element in accordance with embodiments.

With reference to FIG. 2, a heat spreader 201 is provided and includes a module 210, which includes electronics 211 that generate heat during operations thereof, a heat exchanger or cold plate (hereinafter referred to as a "cold plate") 220 that is configured to draw and dissipate the heat generated by the electronics 211, a heat spreading element 230 and a clamp 240. The heat spreading element 230 includes compressible pyrolytic graphite sheets 231 and rigid pyrolytic graphite sheets 232 that are interleaved with the compressible pyrolytic graphite sheets 231. At least one of the compressible pyrolytic graphite sheets 231 and the rigid pyrolytic graphite sheets 232 exhibits in-plane thermal conductivity of greater than about 1000 W/m-K. The compressible pyrolytic graphite sheets 231 and the rigid pyrolytic graphite sheets 232 are much less dense than metallic material, such as copper. For example, a density of the rigid pyrolytic graphite sheets 120 can be less than about 10% a density of metallic material. A density of the compressible pyrolytic graphite sheets 110 can be less than about 10% and, in some cases, less than about 5% a density of metallic material.

As above, in accordance with embodiments, the rigid pyrolytic graphite sheets 232 can have a density of about 1200-1300 kg/m3 and the compressible pyrolytic graphite sheets 231 can have a spongy quality with a density of about 400-500 kg/m3.

Figure 3:
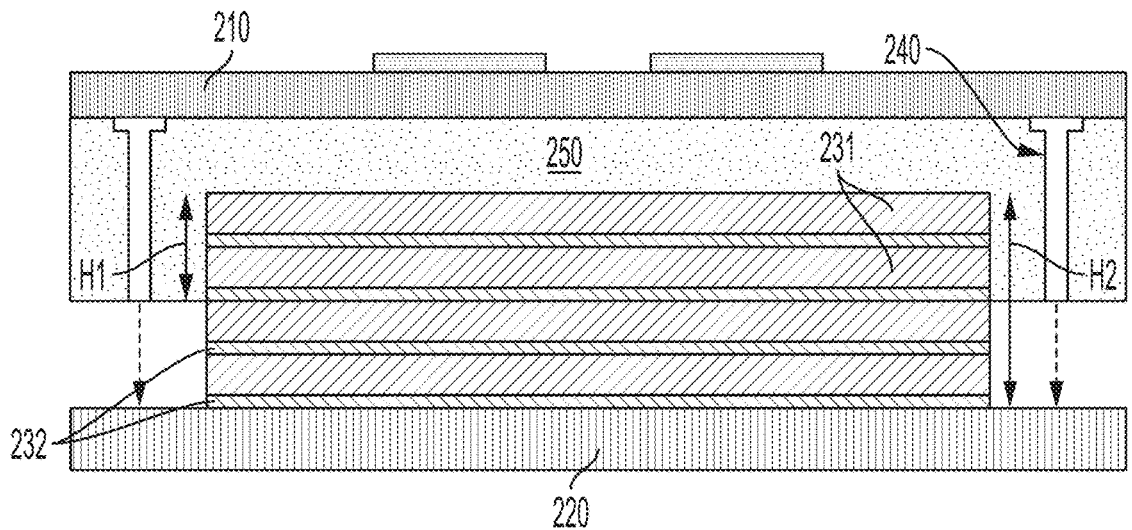
FIG. 3 is a graphical illustration of an assembly of the heat spreader and the heat spreading element of FIG. 2 in accordance with embodiments.

The heat spreading element 230 is interposed between the module 210 and the cold plate 220 to provide for a transfer of the heat generated by the electronics 211 from the module 210 to the cold plate 220 in a first direction (i.e., an interleaving direction A with respect to the interleaving direction of the compressible pyrolytic graphite sheets 231 and the rigid pyrolytic graphite sheets 232). The heat spreading element 230 also spreads the heat out in a second direction (i.e., an in-plane direction B of the compressible pyrolytic graphite sheets 231 and the rigid pyrolytic graphite sheets 232) transverse with respect to the first direction. The clamp 240 can include screws 241 that are engageable with at least the cold plate 220 to draw the cold plate 220 toward the module 210. The clamp 240 can alternatively include or be provided with various other configurations that serve to draw the cold plate 220 toward the module 210. In any case, the clamp 240 serves to clamp the heat spreading element 230 between the module 210 and the cold plate 220 and to compress the compressible pyrolytic graphite sheets 231 and the rigid pyrolytic graphite sheets 232 in the first direction or the interleaving direction A (FIG. 3 illustratively shows that only the compressible pyrolytic graphite sheets 231 are compressed; this is done for clarity and is not necessarily the case). This compression of the compressible pyrolytic graphite sheets 231 and the rigid pyrolytic graphite sheets 232 effectively activates the in-plane thermal conductivity of the compressible pyrolytic graphite sheets 231 and the rigid pyrolytic graphite sheets 232.

In accordance with embodiments, the clamp 240 can be used to compress the compressible pyrolytic graphite sheets 231 and the rigid pyrolytic graphite sheets 232 to tune contact resistances between the compressible pyrolytic graphite sheets 231 and the rigid pyrolytic graphite sheets 232. This can optimize thermal performance of the heat spreading element 230 in general and to optimize thermal performance and the in-plane thermal conductivity of the compressible pyrolytic graphite sheets 231 and the rigid pyrolytic graphite sheets 232.

In accordance with further or alternative embodiments, it is to be understood that the compressible pyrolytic graphite sheets 231 and the rigid pyrolytic graphite sheets 232 need not be interleaved with one another in a 1:1 sequence and that other configurations are possible. These include configurations in which only the compressible pyrolytic graphite sheets 231 are provided and/or configurations in which multiple compressible pyrolytic graphite sheets 232 are interleaved with singular rigid pyrolytic graphite sheets 232.

As shown in FIG. 2, the heat spreader 201 can also include a monolithic metallic element 250 interposed between the module 210 and the cold plate 220 with the heat spreading element 230. The monolithic metallic element 250 can be formed of a metallic material, such as copper or another suitable metal or metallic alloy. The monolithic metallic element 250 can be provided in a number of configurations but is generally provided as a single, unitary element that is formed to define a pocket 251 in which the heat spreading element 230 is disposable. In this sense, the monolithic metallic element 250 can also engage with or be engaged by the clamp 240.

With continued reference to FIG. 2, the heat spreader 201 can also include seals 245. The seals 245 can assume any size, shape and dimension for use with the heat spreader 201. In some, but not all cases, the seals 245 can be disposed and configured to prevent moisture ingress into the heat spreading element 230. In some other cases, the seals 245 can also be disposed and configured to prevent moisture from flowing around the clamp 240 and then into the heat spreading element 230.

With reference to FIG. 3 and in accordance with embodiments, a height H1 of the pocket 251 can be less than a height H2 of the heat spreading element 230 prior to the compressible pyrolytic graphite sheets 231 and the rigid pyrolytic graphite sheets 232 being compressed. Thus, as above, the height H1 of the pocket 251 can be tuned along with the clamp 240 to compress the compressible pyrolytic graphite sheets 231 and the rigid pyrolytic graphite sheets 232 to optimize thermal performance of the heat spreading element 230. That is, where the compressible pyrolytic graphite sheets 231 and the rigid pyrolytic graphite sheets 232 are compressed from the height H2 to the height H1 of the pocket 251, this degree of compression optimizes the thermal performance of the heat spreading element 230.

In accordance with embodiments, a degree of compression can be about 5-60% of the height H2.

The compressibility of the compressible pyrolytic graphite sheets 231 can provide for coefficient of thermal expansion (CTE) mismatch compliance among at least two or more of the module 210, the monolithic metallic element 250, the rigid pyrolytic graphite sheets 232, and the cold plate 220.

Figure 4:
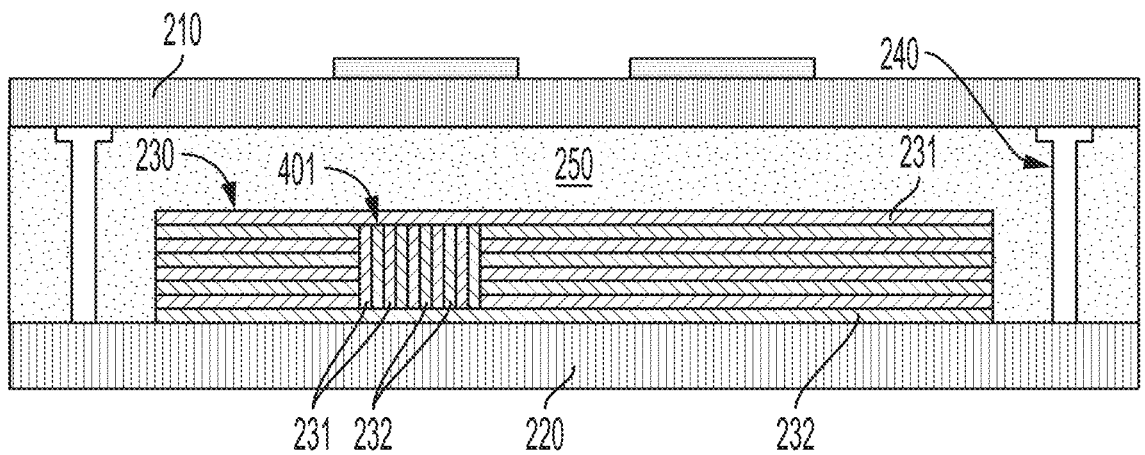
FIG. 4 is a side schematic view of a heat spreader with a heat spreading element and a transverse section in accordance with embodiments.

With reference to FIG. 4 and in accordance with further embodiments, the heat spreading element 230 of FIGS. 2 and 3 can be provided in hybridized configurations, arrangements and formations. For example, as shown in FIG. 4, the heat spreading element 230 can include the compressible pyrolytic graphite sheets 231 and the rigid pyrolytic graphite sheets 232 as well as a transverse section 401. This transverse section 401 can be, but is not required to be, provided within the heat spreading element 230 and can include the compressible pyrolytic graphite sheets 231 and the rigid pyrolytic graphite sheets 232. The compressible pyrolytic graphite sheets 231 and the rigid pyrolytic graphite sheets 232 of the transverse section 401 are oriented or otherwise turned transversely or perpendicularly with respect to a rest of the heat spreading element 230. In this way, the transverse section 401 can function like a via for heat spreading in through-thickness directions (in addition to the in-plane heat spreading of the compressible pyrolytic graphite sheets 231 and the rigid pyrolytic graphite sheets 232). The compressible pyrolytic graphite sheets 231 and the rigid pyrolytic graphite sheets 232 of the transverse section 401 can be compressed (i.e., by the rest of the heat spreading element 230) and thus can provide for a high degree of in-plane thermal conduction between the module 210 and the cold plate 220. This transverse section 401 can be disposed at or near a hot spot of the module 210.

Although the transverse section 401 is illustrated in FIG. 4 as being sandwiched between a compressible pyrolytic graphite sheet 231 and a rigid pyrolytic graphite sheet 232, it is to be understood that this is not required and that other embodiments are possible. For example, the traverse section 401 could be in direct contact with one or both of the cold plate 220 and the monolithic metallic element 250.

Figure 5:
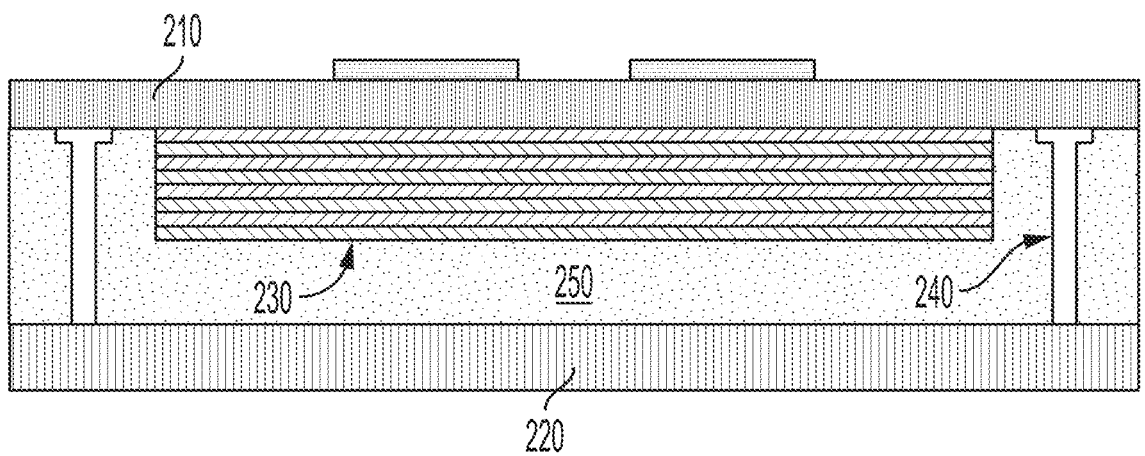
FIG. 5 is a side schematic view of a heat spreader with a heat spreading element in accordance with alternative embodiments.
Figure 6:
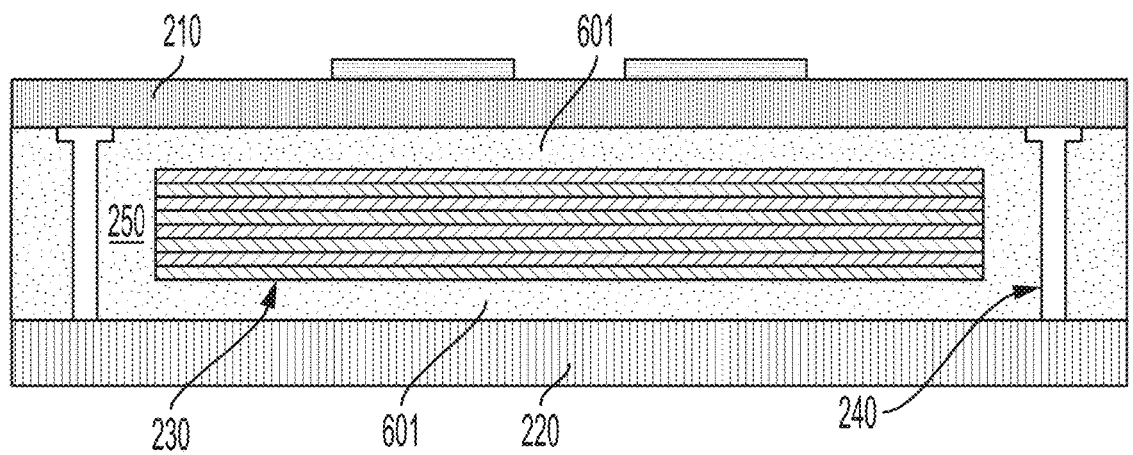
FIG. 6 is a side schematic view of a heat spreader with a heat spreading element in accordance with alternative embodiments.
Figure 7:
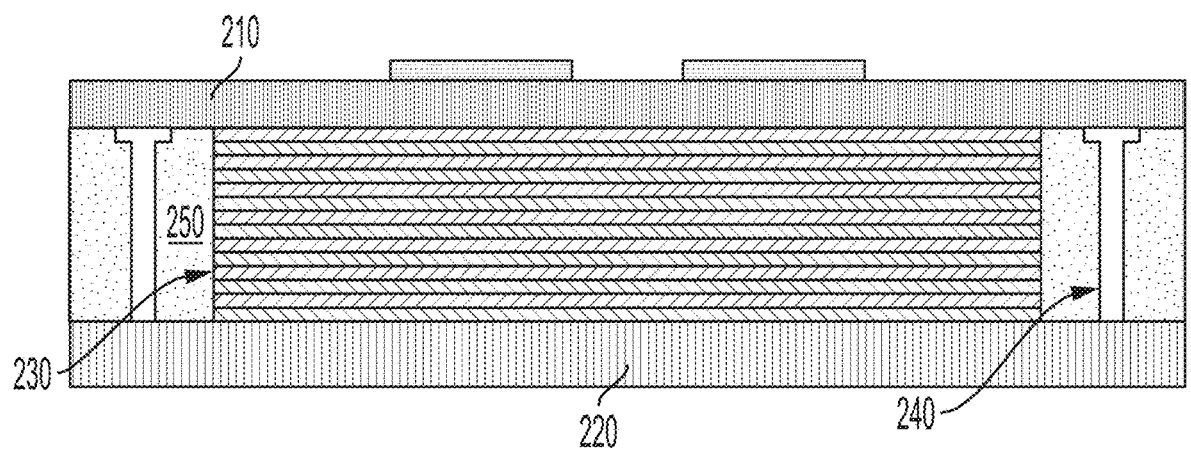
FIG. 7 is a side schematic view of a heat spreader with a heat spreading element in accordance with alternative embodiments.

With reference to FIGS. 5-7 and in accordance with further embodiments, the monolithic metallic element 250 can be formed such that the pocket 251 can have multiple varied configurations. For example, while the pocket 251 of FIGS. 2 and 3 is adjacent to the cold plate 220, the pocket 251 could be adjacent to the module 210 (see FIG. 5), the pocket 251 could be sandwiched on each side by portions 601 of the monolithic metallic element 250 (see FIG. 6) or the pocket 251 could extend through an entire span of the distance between the module 210 and the cold plate 220 (see FIG. 7).

Figure 8:
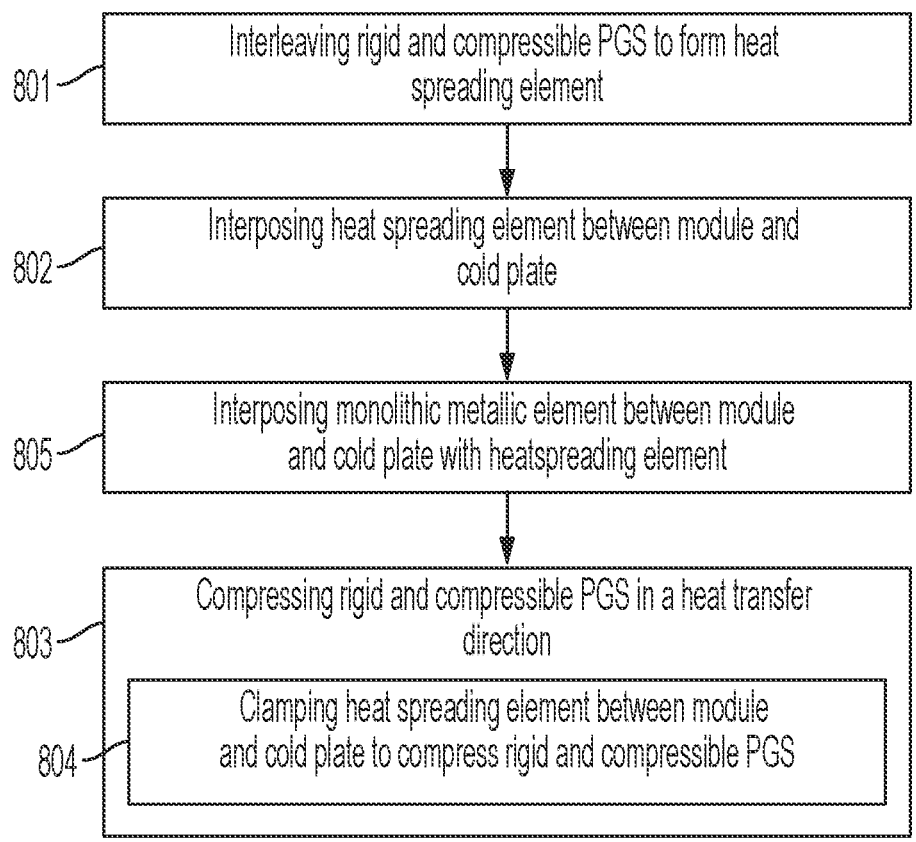
FIG. 8 is a flow diagram illustrating a method of assembling a heat spreading in accordance with embodiments.

With reference to FIG. 8, a method of assembling a heat spreader, such as the heat spreader 201 described above, is provided. As shown in FIG. 8, the method includes interleaving rigid pyrolytic graphite sheets with compressible pyrolytic graphite sheets to form a heat spreading element to provide for a transfer of heat and to spread the heat out (block 801) and compressing the compressible pyrolytic graphite sheets and the rigid pyrolytic graphite sheets in a direction of the transfer of the heat (block 802). In accordance with embodiments, the method can further include interposing the heat spreading element between a module and a cold plate to provide for the transfer of heat from the module to the cold plate in a first direction and to spread the heat out in a second direction transverse with respect to the first direction (block 803). In addition, the compressing can include clamping the heat spreading element between the module and the cold plate to compress the compressible pyrolytic graphite sheets and the rigid pyrolytic graphite sheets in the first direction (block 804). The method can further include interposing a monolithic metallic element between the module and the cold plate with the heat spreading element (block 805).

Technical effects and benefits of the present disclosure are the provision of PGS in a cold plate application, where the PGS is extremely conductive in plane (>1000 W/m-K) and about 10% or less dense than typical highly conductive materials. The result is that heat spreading performance can at least match that of copper heat spreaders with a significant reduction in weight (at least ~20-30% compared to typical copper designs). The clamping of the PGS together eliminates the need for an epoxy-based material between the PGS. This provides for further weight reduction while also increasing thermal performance.

The corresponding structures, materials, acts, and equivalents of all means or step-plus function elements in the claims below are intended to include any structure, material, or act for performing the function in combination with other claimed elements as specifically claimed. The description of the present disclosure has been presented for purposes of illustration and description, but is not intended to be exhaustive or limited to the technical concepts in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

While the preferred embodiments to the disclosure have been described, it will be understood that those skilled in the art, both now and in the future, may make various improvements and enhancements which fall within the scope of the claims which follow. These claims should be construed to maintain the proper protection for the disclosure first described.

What is claimed is:

1. A heat spreader, comprising:
   compressible pyrolytic graphite sheets;
   rigid pyrolytic graphite sheets interleaved with the compressible pyrolytic graphite sheets to form a heat spreading element to provide for a transfer of heat and to spread the heat out; and
   a clamp to clamp the heat spreading element and to apply a compression force to the compressible pyrolytic graphite sheets and the rigid pyrolytic graphite sheets in a direction of the transfer of the heat,
   wherein:
   the compressible pyrolytic graphite sheets are half as dense as the rigid pyrolytic graphite sheets, and
   only compression of the compressible pyrolytic graphite sheets due to application of the compression force contributes to a reduction of a height of the heat spreading element,
   wherein the heat spreader further comprises a module, a cold plate and a monolithic metallic element with an upside-down u-shaped cross-sectional shape interposed between the module and the cold plate with the heat spreading element, the monolithic metallic element being configured to abut sidewalls and an uppermost surface of the heat spreading element.

2. The heat spreader according to claim 1, wherein:
   at least one of the compressible pyrolytic graphite sheets and the rigid pyrolytic graphite sheets exhibits in-plane thermal conductivity of greater than about 1000 W/m-K, and
   densities of the rigid pyrolytic graphite sheets are less than about 10% a density of copper and densities of the compressible graphite sheets are less than about 5% the density of copper.

3. The heat spreader according to claim 1, wherein the direction of the transfer of the heat is an interleaving direction of the compressible pyrolytic graphite sheets and the rigid pyrolytic graphite sheets.

4. The heat spreader according to claim 1, further comprising seals to prevent moisture ingress to or about at least one of the heat spreading element and the clamp.

5. The heat spreader according to claim 1,
   wherein:
   the heat spreading element is interposed between the module and the cold plate to provide for the transfer of heat from the module to the cold plate in a first direction and to spread the heat out in a second direction transverse with respect to the first direction, and
   the clamp is disposed and configured to clamp the heat spreading element between the module and the cold plate and to apply the compression force to the compressible pyrolytic graphite sheets and the rigid pyrolytic graphite sheets in the first direction.

6. The heat spreader according to claim 5, wherein the module comprises electronic elements that generate the heat.

7. The heat spreader according to claim 5, wherein the first direction is in an interleaving direction of the compressible pyrolytic graphite sheets and the rigid pyrolytic graphite sheets.

8. The heat spreader according to claim 5, wherein the clamp is tuned to apply the compression force to the compressible pyrolytic graphite sheets and the rigid pyrolytic graphite sheets to optimize thermal performance.

9. The heat spreader according to claim 5, further comprising seals to prevent moisture ingress to or about at least one of the heat spreading element and the clamp.

10. The heat spreader according to claim 5, wherein:
    the monolithic metallic element is engaged by the clamp and defines a pocket in which the heat spreading element is disposed, and
    the reduction of the height of the heat spreading element is such that the height of the heat spreading element is reduced to a height of the pocket.

11. The heat spreader according to claim 10, wherein:
    at least two or more of the module, the monolithic metallic element, the rigid pyrolytic graphite sheets and the cold plate have different CTEs,
    the compressible pyrolytic graphite sheets are compressed in the first direction with the monolithic metallic element contacting the module and the cold plate, and
    the compressibility of the compressible pyrolytic graphite sheets provides for CTE mismatch compliance among the at least two or more of the module, the monolithic metallic element, the rigid pyrolytic graphite sheets and the cold plate that have the different CTEs with the heat spreading element disposed in the pocket and the clamp engaging with the monolithic metallic element and the heat spreading element.

12. The heat spreader according to claim 10, wherein a height of the pocket is less than a height of the heat spreading element prior to the application of the compression force to the compressible pyrolytic graphite sheets and the rigid pyrolytic graphite.

13. A method of assembling the heat spreader according to claim 1, the method comprising:
    interleaving the rigid pyrolytic graphite sheets with the compressible pyrolytic graphite sheets to form the heat spreading element to provide for a transfer of heat and to spread the heat out; and
    applying a compressing force to the compressible pyrolytic graphite sheets and the rigid pyrolytic graphite sheets in the direction of the transfer of the heat.

14. The method according to claim 13, wherein:
the method further comprises interposing the heat spreading element between a module and a cold plate to provide for the transfer of heat from the module to the cold plate in a first direction and to spread the heat out in a second direction transverse with respect to the first direction, and
the compressing comprises clamping the heat spreading element between the module and the cold plate to compress the compressible pyrolytic graphite sheets and the rigid pyrolytic graphite sheets in the first direction.

15. The method according to claim 14, further comprising interposing a monolithic metallic element between the module and the cold plate with the heat spreading element.

16. The heat spreader according to claim 5, further comprising a monolithic metallic element interposed between the module and the cold plate with the heat spreading element.

17. A heat spreader, comprising:
compressible pyrolytic graphite sheets;
incompressible pyrolytic graphite sheets interleaved with the compressible pyrolytic graphite sheets to form a heat spreading element to provide for a transfer of a heat and to spread the heat out; and
a clamp to clamp the heat spreading element and to apply a compression force to the compressible pyrolytic graphite sheets and the incompressible pyrolytic graphite sheets in a direction of the transfer of the heat,
wherein the compressible pyrolytic graphite sheets are half as dense as the incompressible pyrolytic graphite sheets and the heat spreader further comprises a module, a cold plate and a monolithic metallic element with an upside-down u-shaped cross-sectional shape interposed between the module and the cold plate with the heat spreading element, the monolithic metallic element being configured to abut sidewalls and an uppermost surface of the heat spreading element.

18. The heat spreader according to claim 17, wherein:
the heat spreading element is interposed between the module and the cold plate to provide for the transfer of heat from the module to the cold plate in a first direction and to spread the heat out in a second direction transverse with respect to the first direction,
the clamp is disposed and configured to clamp the heat spreading element between the module and the cold plate and to apply the compression force in the first direction,
the first direction is in an interleaving direction of the compressible pyrolytic graphite sheets and the incompressible pyrolytic graphite sheets, and
the monolithic metallic element is configured to abut sidewalls and an uppermost surface of the heat spreading element.

19. The heat spreader according to claim 18, wherein the clamp is tuned to apply the compression force to the compressible pyrolytic graphite sheets and the incompressible pyrolytic graphite sheets to optimize thermal performance thereof.

20. The heat spreader according to claim 18, wherein:
wherein:
the monolithic metallic element defines a pocket in which the heat spreading element is disposable, and
a reduction of the height of the heat spreading element caused by application of the compression force is such that the height of the heat spreading element is reduced to a height of the pocket.

* * * * *